United States Patent
Bautista, Jr. et al.

(10) Patent No.: US 6,459,628 B1
(45) Date of Patent: Oct. 1, 2002

(54) SYSTEM AND METHOD TO FACILITATE STABILIZATION OF REFERENCE VOLTAGE SIGNALS IN MEMORY DEVICES

(75) Inventors: Edward V. Bautista, Jr., Santa Clara, CA (US); Weng Fook Lee, Penang (MY); Santosh K. Yachareni, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/824,166

(22) Filed: Apr. 2, 2001

(51) Int. Cl.$^7$ ................................................. G11C 7/00
(52) U.S. Cl. ................... 365/194; 365/191; 365/189.05
(58) Field of Search ............................... 365/194, 191, 365/189.05

(56) References Cited

U.S. PATENT DOCUMENTS

| | | | |
|---|---|---|---|
| 5,386,385 A | * | 1/1995 | Stephens, Jr. ............ 365/189.01 |
| 5,798,974 A | * | 8/1998 | Yamagata ..................... 365/194 |
| 5,978,275 A | | 11/1999 | Song et al. |
| 5,991,851 A | * | 11/1999 | Alwais et al. ............... 711/100 |
| 6,002,599 A | | 12/1999 | Chow |
| 6,021,264 A | * | 2/2000 | Morita ......................... 710/117 |
| 6,055,208 A | * | 4/2000 | Morgan et al. ............... 365/191 |
| 6,072,722 A | | 6/2000 | Hirano |
| 6,091,613 A | | 7/2000 | Yang et al. |
| 6,097,632 A | | 8/2000 | Roohparvar |
| 6,101,118 A | | 8/2000 | Mulatti et al. |
| 6,154,396 A | * | 11/2000 | Yabe et al. ............. 365/189.05 |
| 6,169,700 B1 | * | 1/2001 | Luo ......................... 365/189.04 |
| 6,172,935 B1 | * | 1/2001 | Wright et al. ................ 365/194 |
| 6,222,791 B1 | * | 4/2001 | Becker et al. ............... 327/212 |
| 6,292,412 B1 | * | 9/2001 | Kato et al. ................... 365/194 |
| 6,324,122 B1 | * | 11/2001 | Sun et al. .................... 365/194 |

* cited by examiner

*Primary Examiner*—David Nelms
*Assistant Examiner*—Ly Dny Pham
(74) *Attorney, Agent, or Firm*—Eschweiler & Associates, LLC

(57) ABSTRACT

A wait system for a memory device is operative to provide a wait signal to delay performance of each operation relative the memory cell. The wait signal initially delays performance of at least one initial operation relative the memory cell during a given user mode by a first duration. After the initial wait signal, a subsequent wait signal is provided to delay performance of subsequent operations relative the memory cell during the given user mode by a second duration, which is less than the first duration.

24 Claims, 5 Drawing Sheets

SYSTEM AND METHOD TO FACILITATE STABILIZATION OF REFERENCE VOLTAGE SIGNALS IN MEMORY DEVICES

FIELD OF THE INVENTION

The present invention relates generally to memory devices and, more particularly, to a system and method to facilitate stabilization of reference voltage signals in memory devices.

BACKGROUND OF THE INVENTION

Flash memory is a type of electronic memory media which can be rewritten and hold its content without power. Flash memory devices generally have life spans from 100K to 1M write cycles. Unlike dynamic random access memory (DRAM) and static random access memory (SRAM) memory chips, in which a single byte can be erased, flash memory is typically erased and written in fixed multi-bit blocks or sectors. Evolving out of electrically erasable read only memory (EEPROM) chip technology, which can be erased in place, flash memory is less expensive and denser. This new category of EEPROMs has emerged as an important non-volatile memory which combines the advantages of EPROM density with EEPROM electrical erasability.

Conventional flash memories are constructed in a cell structure wherein a single bit of information is stored in each cell. In such single bit memory architectures, each cell typically includes a metal oxide semiconductor (MOS) transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

The control gate is connected to a word line associated with a row of such cells to form sectors of such cells in a typical NOR configuration. In addition, the drain regions of the cells are connected together by a conductive bit line. The channel of the cell conducts current between the source and the drain in accordance with an electric field developed in the channel by the stacked gate structure. In the NOR configuration, each drain terminal of the transistors within a single column is connected to the same bit line. In addition, each flash cell associated with a given bit line has its stacked gate terminal coupled to a different word line, while all the flash cells in the array have their source terminals coupled to a common source terminal. In operation, individual flash cells are addressed via the respective bit line and word line using peripheral decoder and control circuitry for programming (writing), reading, or erasing functions.

Such a single bit stacked gate flash memory cell is programmed by applying a relatively high voltage to the control gate and connecting the source to ground and the drain to a predetermined potential above the source.

By way of example, flash memories have a typical operating voltage of about 5 volts. A reference voltage, however, is usually required for programming and erase operations in a flash memory. The reference voltage usually is in the range of about 1.29 to 1.31 volts, but can be higher. When the reference voltage is enabled, it ramps up to a desired level, taking time to stabilize. If programming occurs prior to the reference voltage sufficiently stabilizing, there is an increased likelihood of errors during programming.

During a programming operation, electrons are injected onto the floating gate by applying a regulated voltage signal based on the reference voltage to the control gate and about one-half the regulated voltage to the drain region while the source region is grounded. A resulting high electric field across the tunnel oxide leads to a phenomena called "Fowler-Nordheim" tunneling. During this process, electrons in the core cell channel region tunnel through the gate oxide into the floating gate and become trapped in the floating gate since the interpoly dielectric and the tunnel oxide surround the floating gate. As a result of the trapped electrons, the threshold voltage of the cell increases. The change in the threshold voltage (and thereby the channel conductance) of the cell created by the trapped electrons is what causes the cell to be programmed. In order to generate the reference voltages required to program and erase memory cells, a reference voltage circuit ramps up to a predetermined voltage.

In order to erase a typical single bit stacked gate flash memory cell, a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

In conventional single bit flash memory devices, erase verification is performed to determine whether each cell in a block or set of such cells has been properly erased. Current single bit erase verification methodologies provide for verification of bit or cell erasure, and application of supplemental erase pulses to to individual cells which fail the initial verification. Thereafter, the erased status of the cell is again verified, and the process continues until the cell or bit is successfully erased or the cell is marked as unusable.

SUMMARY

The present invention provides a system and related method to facilitate stabilization of a reference voltage signal in a memory device. A wait system is operative to provide a wait signal to delay performance of each operation relative the memory cell. The wait signal is operative to delay performance of at least one initial operation relative the memory cell during a given user mode by a first duration. After the initial wait signal, the wait signal is provided to delay performance of subsequent operations relative the memory cell during the given user mode by a second duration, which is less than the first duration. The initial, greater amount of initial delay enables a reference signal to sufficiently ramp up to a desired level at the beginning of a user mode so as to mitigate errors that could otherwise occur if the reference signal did not stabilize at its desired level.

In accordance with one particular aspect, the initial wait signal may be selectable so as to provide a selected amount of delay. For example, the wait system may include a selection system operative to receive a selection signal having at least two conditions. The selection signal is operative to select which of at least two signals having different associated durations is to be provided as the initial wait signal according to the condition of the selection signal. For example, in a case when the system is implemented as part of an integrated circuit, the selection system may include a metal option. The metal option may have two or more user-selectable conditions (e.g., different fixed voltage levels), each of which provides a different selection signal, thereby controlling which of the signals will be provided as the initial wait signal.

In accordance with another aspect of the present invention, the initial wait signal may be masked for the subsequent operations in the given user mode to be performed relative the memory cell. By masking the initial wait signal, subsequent wait signals during the given user mode may be provided so as to provide a lesser amount of delay for subsequent operations to be performed relative the memory cell.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF THE INVENTION

The present invention provides a system and method to facilitate stabilization of a reference voltage signal in a memory device. An initial wait signal delays performance of an initial operation relative the memory cell during a given user mode. After the initial wait signal, a different wait signal is employed to delay performance of subsequent operations relative. The greater amount of the initial delay enables a reference signal to sufficiently ramp up to a desired level at the beginning of a user mode.

Figure 1:
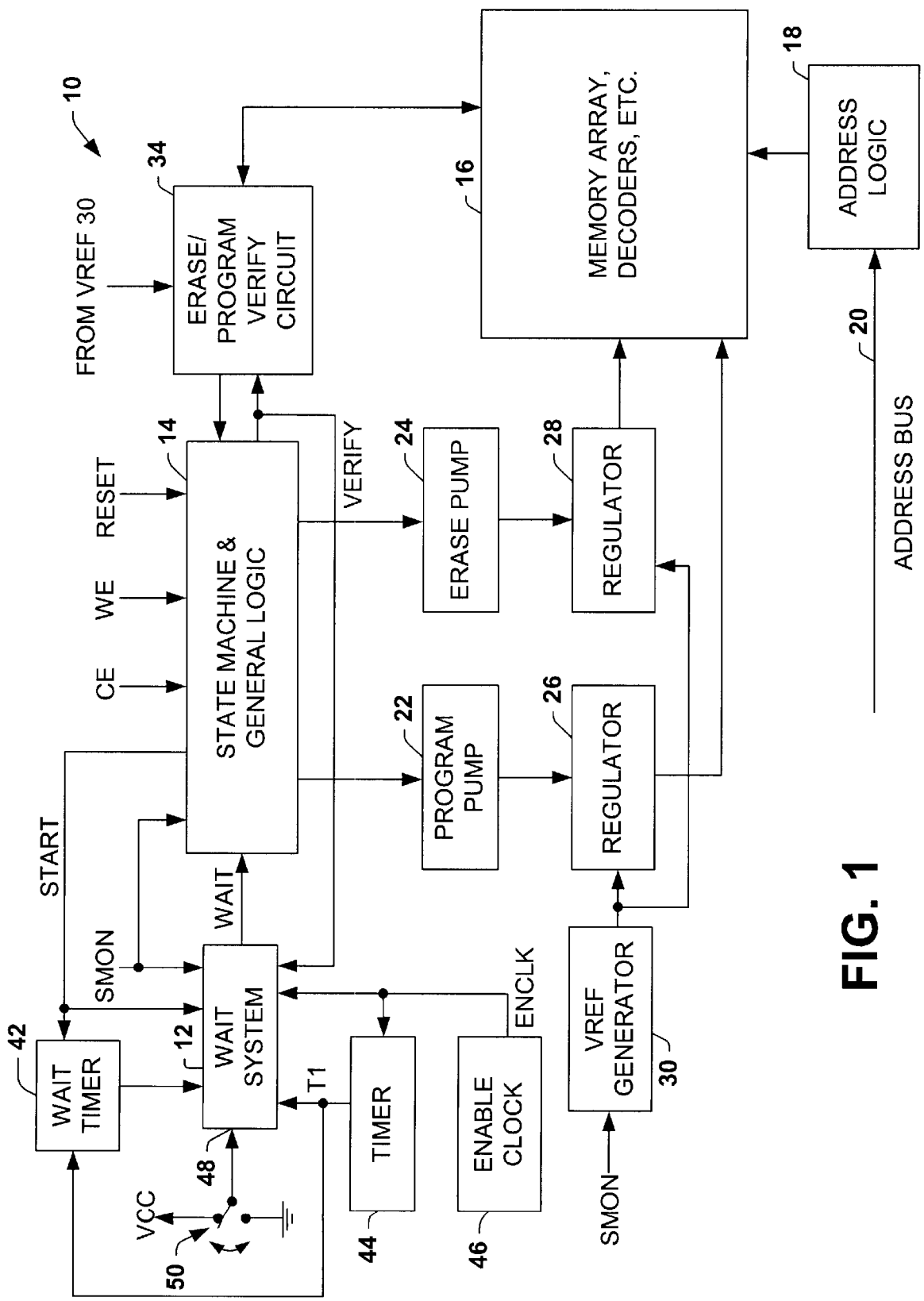
FIG. 1 is a functional block diagram illustrating a memory circuit incorporating a wait system in accordance with the present invention.

FIG. 1 illustrates an exemplary typical memory system 10 incorporating a wait system 12 in accordance with an aspect of the present invention. The memory system 10 is part of an integrated circuit memory chip. For purposes of simplicity of explanation, the memory system 10 will be described in the context of flash memory, although one skilled in the art will understand and appreciate that other types of circuits, such as, for example, a dynamic random access memory (DRAM) chip, a static random access memory (SRAM) chip, an electrically erasable read only memory (EEPROM) chip, also may implement a wait system in accordance with an aspect of the present invention.

The memory system 10 includes a state machine and control logic block 14 (hereinafter referred to as the "state machine 14") for controlling operation of the memory system 10. The state machine 14 is operably coupled to a memory block, indicated schematically at 16. The state machine 14 is programmed and/or configured to control the processes of storing and removing a charge on floating gate memory cells of the memory block 16. The state machine 14, for example, controls the operation of the memory block 16 in response to incoming command and control signals on control lines, such as from an associated processor (not shown).

The memory block 16 includes an array of memory cells and decoders for controlling which part of the memory array is to be accessed, such as for programming, erasing, and/or verifying operations. The memory array/decoders 16 is operable to program and erase cells of the flash memory upon receiving appropriate control signals. An address logic block 18, which may include data latches and suitable input/output buffers, is operatively coupled to the memory block 16. The address logic 18 receives program data via an address bus 20.

The state machine 14 also is coupled to a program pump 22 and to an erase pump 24 for respectively implementing program and erase operations relative to the memory block 16. More particularly, each pump 22, 24 receives a voltage control channel (VCC) signal to supply a boosted voltage. Each pump 22, 24 is further coupled to an associated regulation circuit 26, 28 that receives high voltage signals from its associated pump. The voltage regulators 26 and 28 receive a reference voltage signal from a reference voltage generator 30, which is activated in response to a State Machine ON (SMON) signal. Typically, the reference voltage generator 30 ramps up to a desired voltage level upon beginning a program/erase operation or a program/erase verify operation, respectively. However, if such operations occur before the reference voltage sufficiently stabilizes at the desired level, errors associated with the operation (e.g., program, erase, program verify, erase verify, etc.) are more likely to occur. The regulators 26 and 28 are coupled to the memory block 16 and, in particular, to the decoders thereof. The regulators 26 and 28 produce controlled voltage signals based on the reference voltage, which are selectively applied to sources of the floating gate memory cells.

The state machine 14 also is coupled to an erase/program verify circuit 34 for providing a VERIFY control signal to initiate a verify operation. The state machine 14, for example, is programmed and/or configured to activate the verify circuit 34 after every programming and erase operation in order to assure that the selected cell(s) has been effectively programmed or erased. The erase/program verify circuit 34 is operable to receive the reference voltage signal from the reference voltage generator 30 and generate erase verify voltage signals and program verify voltage signals, respectively, based on the reference voltage signal. Such verify signals are then selectively applied to the memory cells during the appropriate cell verify operations. The verify circuit 34 provides the results of the program verify operation to the state machine 14.

The state machine 14 controls operation of the pumps 22 and 24 in dependence upon the control signals it receives. The state machine receives a plurality of input signals based on which it controls operation of the memory system 10. For example, the state machine receives a Chip Enable (CE) signal, a Write Enable (WE) signal, and a RESET signal. The state machine 14 also receives the SMON, such as from an associated processor or other device, which controls activation of the state machine.

In order to facilitate operation of the memory system 10, the state machine 14 also is coupled to the wait system 12 in accordance with an aspect of the present invention. The wait system 12 provides a WAIT signal to the state machine 14 for delaying operations performed relative one or more cells of the memory block 16. More particularly, the WAIT signal is of a duration to permit the reference voltage signal VREF to appropriately stabilize to a desired level prior to performing an erase, program, or verify operation on the memory block 16. As mentioned above, if the VREF signal does not adequately stabilize prior to the initial operation on the memory block 16, there is an increased likelihood of associated errors.

The wait system 12 implements the WAIT signal based on a plurality of input signals associated with the operation of the memory system 10. A wait timer circuit 42 provides a WAITX signal to the wait system 12 and a timer circuit 44 provides a timer signal T1 to the wait system 12 and to the wait timer 42. The WAITX signal provides a base duration for the WAIT signals, for example, about eight clock cycles. The WAITX signal is derived as a function of the T1 signal. An enable clock circuit 46 is coupled to the timer 44 and to the wait system 12 for providing an ENCLK signal. The ENCLK signal enables operation of the timer 44 when the state machine is ON.

The wait system 12 provides a WAIT signal having different operating conditions, namely, an initial WAIT signal and subsequent WAIT signals. The subsequent WAIT signals are typically shorter in duration than the initial WAIT signal. At the beginning of a user mode, for example, such as when the state machine is activated via the SMON signal, the wait system 12 provides the initial WAIT signal, which corresponds to a first wait state. The initial WAIT signal is provided to the state machine 14, which causes the state machine to delay activating one of its associated voltage pump circuits 22, 24 or the verify circuit 34. While the state machine 14 is ON for subsequent operations during the same user mode, the wait system 12 may provide a WAIT signal of a shorter duration (e.g., corresponding to the WAITX signal), as the reference voltage has already been ramped up to its desired level.

The wait signal thus implements a delay at the state machine so as to provide the reference voltage generator 30 sufficient time to ramp up and stabilize at a desired level, thereby mitigating the likelihood of errors that could occur if the reference voltage did not properly stabilize. In particular, there is an increased likelihood of errors occurring if the regulators are activated to program or erase or if the erase/program verify circuit 34 is activated to initiate one of the verify functions when the VREF generator 30 is not sufficiently stabilized. Therefore, by causing the state machine 14 to further delay activation of the voltage pumps 22, 24 or the erase/program verify circuit 34 by an additional amount at the beginning of a user mode, there is a reduced likelihood of such errors occurring.

In accordance with an aspect of the present invention, the duration of the WAIT signal may be user-selectable to control the length of a wait state prior to initiating a user mode operation relative to the memory 16. For example, an integrated circuit incorporating the memory system 10 may include a metal option input 48 for selecting the duration of the WAIT signal at the beginning of a user mode based on the signal at the metal option input. The metal option input 48 is coupled to a selectable voltage potential through a switch or other connection, indicated at 50. For example, by connecting the input 48 to VCC, a first duration of delay for the wait state may be selected, and by setting the input to another potential (e.g., VSS) a different duration of delay may be selected for the wait state at the beginning of a user mode. As a result, a user may selectively extend the duration of a wait state at the beginning of a user mode so as to help stabilize the reference voltage and, in turn, mitigate errors associated with performing related programming and/or erasing operations.

It will be appreciated by those skilled in the art that the system 10 of FIG. 1 has been simplified for the purpose of illustrating the present invention and is not intended to be a complete description of a flash memory or the various ways in which a system may be implemented in accordance with the present invention.

Figure 2:
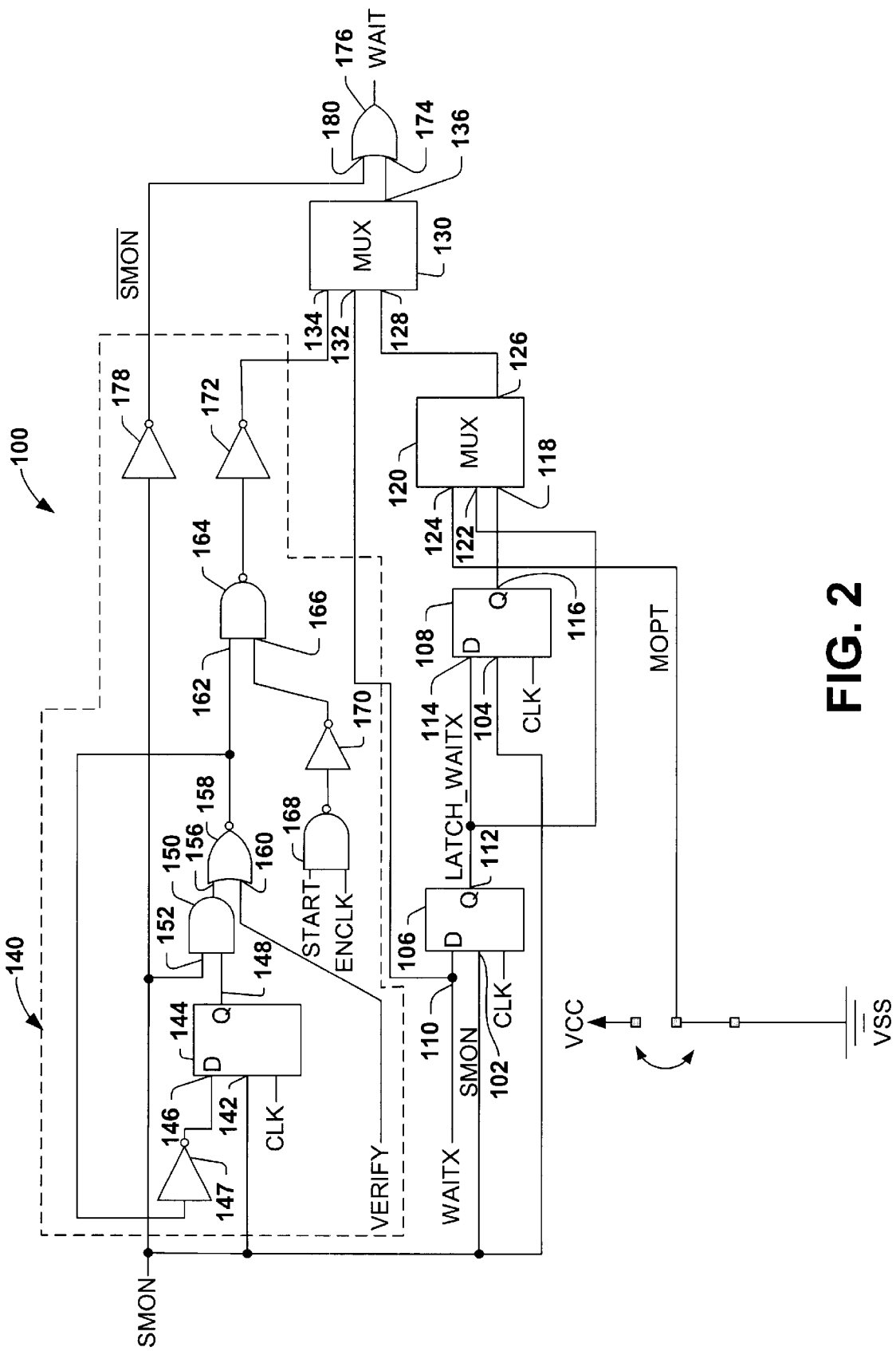
FIG. 2 is schematic diagram of a wait system in accordance with one exemplary aspect of the present invention.

FIG. 2 is an example of a schematic block diagram for a wait system 100 (e.g., the wait system 12 of FIG. 1) in accordance with an aspect of the present invention. A SMON signal is provided to inputs 102 and 104 of a pair of set-type DQ flip-flops 106 and 108. The WAITX signal is provided to a D-input 110 of the flip-flop 106. The flip-flop 106 has an output 112 that provides a LATCH_WAITX signal to a D-input 114 of the flip-flop 108. The LATCH_WAITX signal is derived from the flip-flop 106 latching the WAITX signal. The flip-flop 108 has an output 116 and, in turn, provides a LATCH_LATCH_WAITX signal, which is derived from the flip-flop 108 latching the LATCH_WAITX signal from the flip-flop 106, to an input 118 of a multiplexer 120. The LATCH_WAITX signal is provided to another input 122 of the multiplexer 120.

A selection input 124 of the multiplexer 120 receives a metal option (MOPT) selection signal for selecting which input signal to provide at its output 126. The metal option selection signal, for example, maybe set to VSS (e.g., electrical ground), such as may be a default setting. Alternatively, in this example, the metal option selection input 124 may be coupled to the VCC. In the example illustrated in FIG. 2, the metal option selection signal determines whether the output of the multiplexer 120 will correspond to the LATCH_WAITX signal (e.g., when the option is set to VSS) or the LATCH_LATCH_WAITX signal (e.g., when the option is set to VCC). The output 126 is coupled to an input 128 of another multiplexer 130.

While the example illustrated in FIG. 2 shows a metal option being employed for selecting a duration of an initial wait state, those skilled in the art will appreciate other techniques and circuit configurations that may be utilized to achieve a similar function, all of which are contemplated as being within the scope of the present invention. For example, an array of transistor switches or programmable software may be utilized to achieve such functionality. Moreover, it is to be appreciated that the wait system 100 may be configured to selectively provide more than two possible durations for a wait state at the beginning of a user mode in accordance with an aspect of the present invention.

The WAITX signal is provided to another input 132 of the multiplexer 130. Similar in operation to the multiplexer 120, the multiplexer 130 receives an input signal at a selection input 134 for determining which input 128 or 132 is to be provided at its output 136. In accordance with an aspect of the present invention, the signal provided to the selection input 134 is controlled, such that the multiplexer 130 provides a wait state having an increased amount of delay at the beginning of a user mode, such as according to a selected one of the LATCH_WAITX and LATCH_LATCH_WAITX signals. After the initial wait state, the selection input 134 receives a signal that causes the multiplexer 130 to implements a different (e.g., lesser) amount of delay for subsequent operations during the same user mode.

In this regard, the wait system 100 also includes a masking system 140 which is operative to mask (or prevent) application of the latched signal from the multiplexer 120 subsequent to its initial occurrence upon entering a user mode. The masking system 140 accomplishes this function by providing a selection signal to select the signal from the multiplexer 120 at a first instance (e.g., at the beginning of a user mode) and then switch the selection signal to select the WAITX signal provided at the input 132. By way of example, the signal provided at 126 may be an integer multiple of the WAITX signal. As a result, an increased delay (or wait state) is provided upon entering a user mode so as to mitigate errors associated with performing operations relative to associated memory. After the initial wait state, the system 100 is programmed and/or configured to decrease the delay associated with the wait state to expedite programming yet still provide a delay sufficient to ensure accurate operations relative to the memory.

Turning now to the contents of the exemplary masking system 140, the SMON signal is provided to an input 142 of a DQ flip-flop 144, which may be configured as a reset-type flip-flop. A D-input 146 of the flip-flop 144 receives a feedback signal from a subsequent part of the masking system 140. The feedback signal is provided to the input 146 through an inverter 147. The flip-flop 144 has an output that latches an output signal to an input 148 of an AND gate 150. The SMON signal further is provided to another input 152 of the AND gate 150. The AND gate 150 provides its output to an input 156 of an inverted-OR gate 158. A VERIFY signal (e.g., a program verify or erase verify) is provided to another input 160 of the OR gate 158. The OR gate 158 provides an inverted output signal, which also forms the feedback signal mentioned above, to an input 162 of an AND gate 164.

Another input 166 of the AND gate 164 is provided as a function of the START signal from the state machine and an ENCLK (Enable Clock) signal. In particular, the START and ENCLK signals are provided to corresponding inputs of an AND gate 168. The AND gate 168 provides an inverted output signal to an inverter/buffer 170, which, in turn, provides an output signal to the input 166 of the AND gate 164. The masking circuit 140 thus operates to mask out the latched versions of the WAITX signals (e.g., LATCH_WAITX and LATCH_LATCH_WAITX) based on the condition of the VERIFY, START and ENCLK signals after the initial operation of the associated memory system begins.

The AND gate 164 provides an output signal to an inverter 172. The inverter 172 provides the selection signal to the input 134 of the multiplexer 130, which selects one of the signals provided at its inputs 128 and 132 according to the condition of the selection signal at 134. The multiplexer 130 provides an output signal at 136 corresponding to the signal at 128 or 132 to an input 174 of an OR gate 176. The SMON signal is provided to an inverter 178, which inverts the SMON signal. The inverted SMON signal is, in turn, provided to another input 180 of the OR gate 176. The OR gate 174 provides as its output the WAIT signal.

Figure 3:
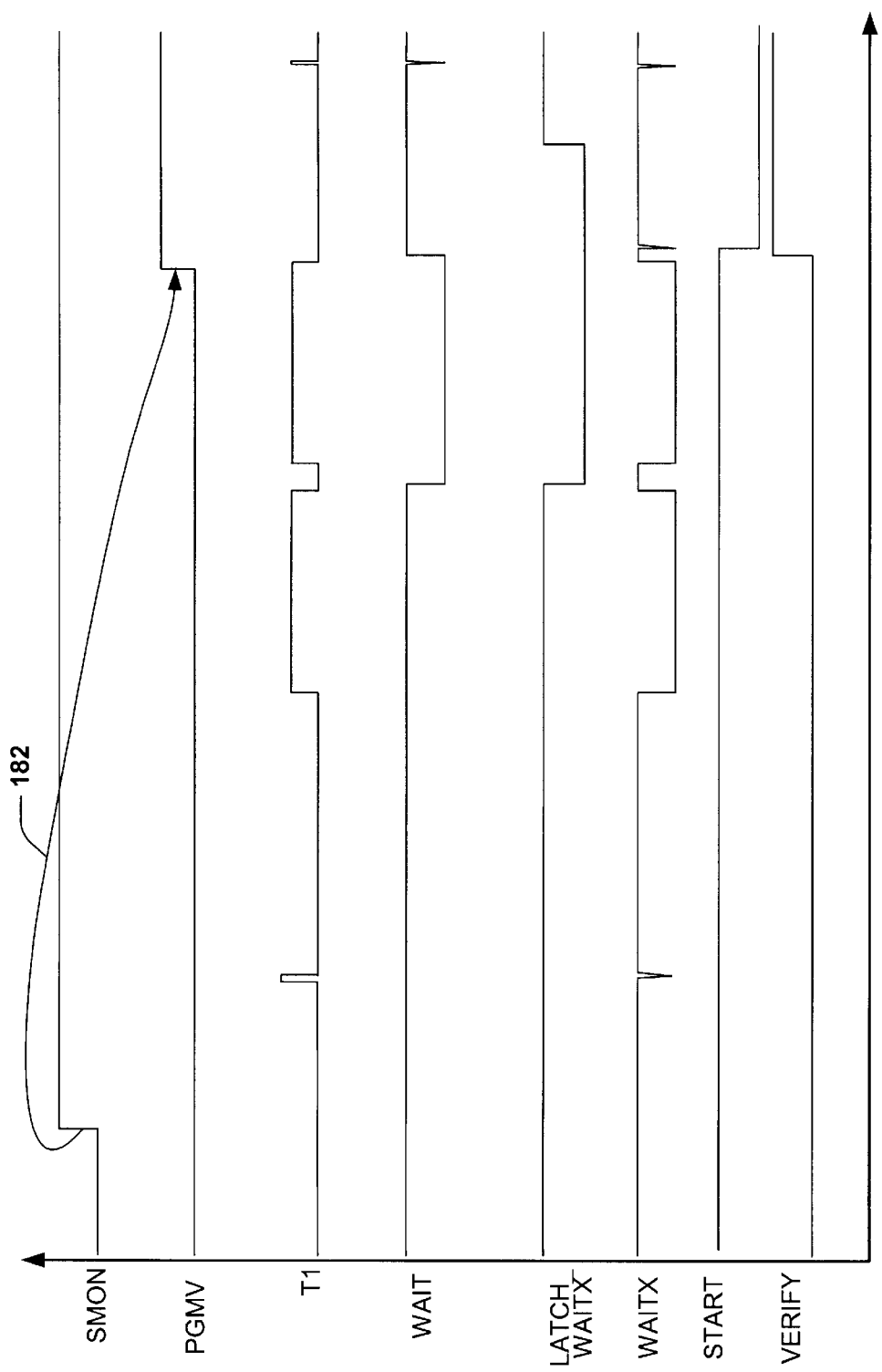
FIG. 3 is a representation of a timing diagram for signals in the circuit of FIG. 2 configured in accordance with one aspect the present invention.
Figure 4:
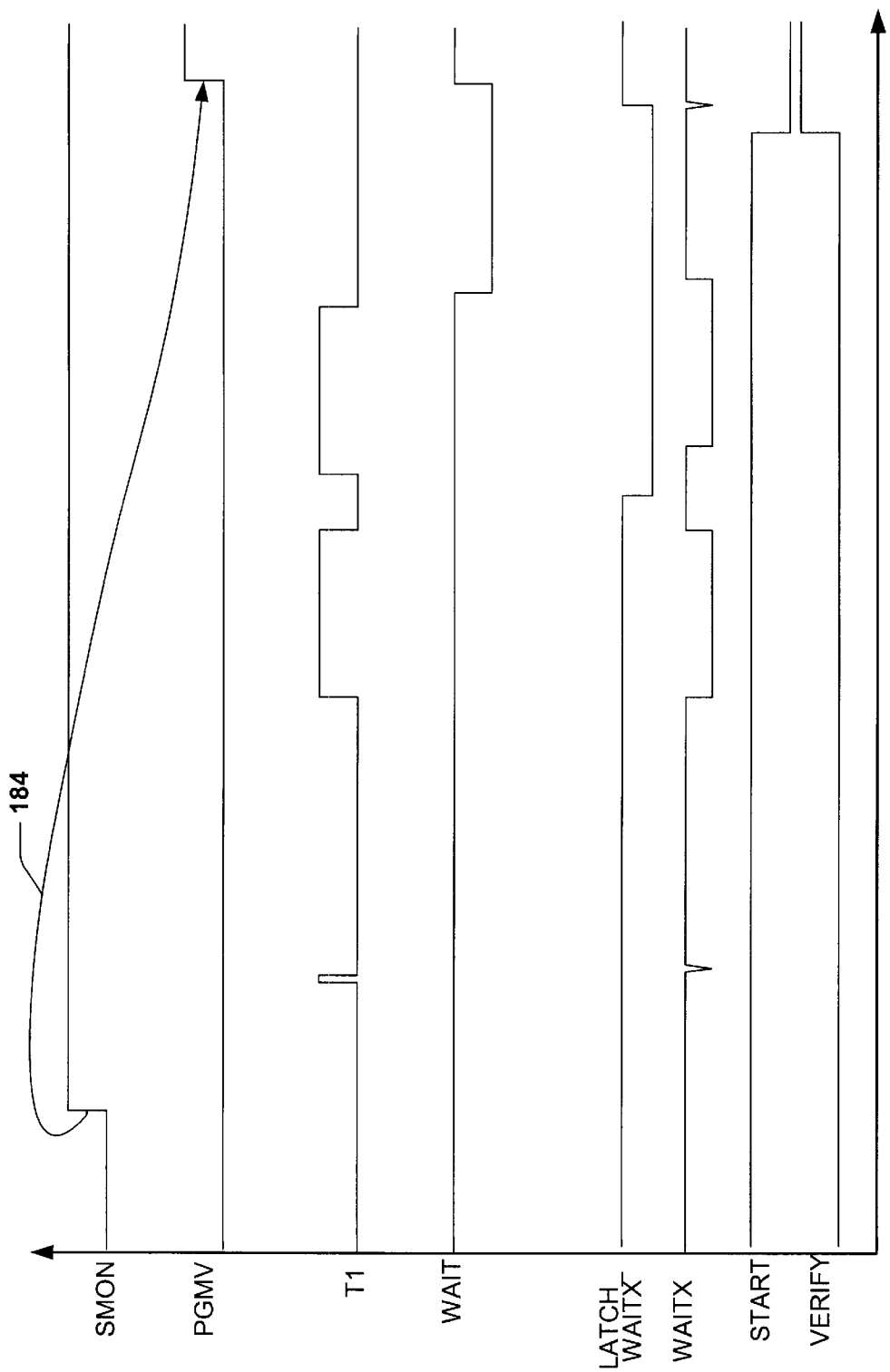
FIG. 4 is a representation of a timing diagram for signals in the circuit of FIG. 2 configured in accordance with another aspect the present invention.

The operation of the wait system 100 of FIG. 2 will be better appreciated with respect to the simulated timing diagrams illustrated in FIGS. 3 and 4, in which various signals from the wait system are plotted versus time. In particular, FIG. 3 corresponds to a situation when the metal option is set to VSS, thereby controlling the multiplexer 120 to provide the LATCH_WAITX signal from the flip-flop 106 to the input 128 of the multiplexer 130. In this way, the LATCH_WAITX signal is latched as the initial WAIT signal at the beginning of a user mode in accordance with an aspect of the present invention.

Referring between FIGS. 2 and 3, upon entering the user mode, indicated by SMON going HIGH, the selection input 134 provides an input signal at 134, such that the multiplexer 130 outputs the LATCH_WAITX signal to the input 174 of OR gate 176. The OR gate 176, in turn, provides the LATCH_WAITX signal as the WAIT signal. As a result, a program voltage control signal (PGMV) (e.g., from the state machine to the program or erase pumps) is delayed from initial activation of the SMON signal by approximately 680 nanoseconds in this example, indicated by arrow 182. As a result, the reference signal has sufficient time to ramp up and stabilize at a desired level.

By way of further illustration, FIG. 4 corresponds to a situation when the metal option is set to VCC, thereby selecting the LATCH_LATCH_WAITX signal to be latched as the initial WAIT signal, in accordance with an aspect of the present invention. Referring between FIGS. 2 and 4, with the metal option set to VCC, the multiplexer 120 selects to provide at its output 126 the signal provided at the input 118. As described above, this corresponds to the output 116 of the flip-flop 108. Consequently, when SMON initially goes high, the selection input 134 selects the input 128 as its output, which is provided to the OR gate 174 while SMON is HIGH, indicating that the state machine 14 is activated.

Referring back to FIG. 2, after the initial WAIT signal at the beginning of the user mode, which may selectively correspond to either the LATCH_WAITX or LATCH_LATCH_WAITX signals from the respective flip-flops 106 and 108, the masking circuit 140 causes the signal provided at the selection input 134 to change conditions. In particular, the change in signal at 134 causes the multiplexer 130 to select the WAITX signal provided at the input 132 for subsequent cycles in the same user mode (e.g., while SMON remains HIGH).

Those skilled in the art will understand and appreciate that the present invention provides a system for implementing a WAIT signal of an increased duration at the beginning of a user mode, such as when a program, erase, or verify operation (erase or program verify) is to be performed. Subsequent WAIT signals during that user mode, however, occur for a shorter duration. By way of example, the first wait cycle during a given user mode may be about eight or sixteen clock cycles, whereas subsequent wait cycles may be about one to three clock cycles in duration. As a result, errors that might occur due to the VREF generator 30 (FIG. 1) insufficiently stabilizing at the beginning of a user mode are mitigated.

Figure 5:
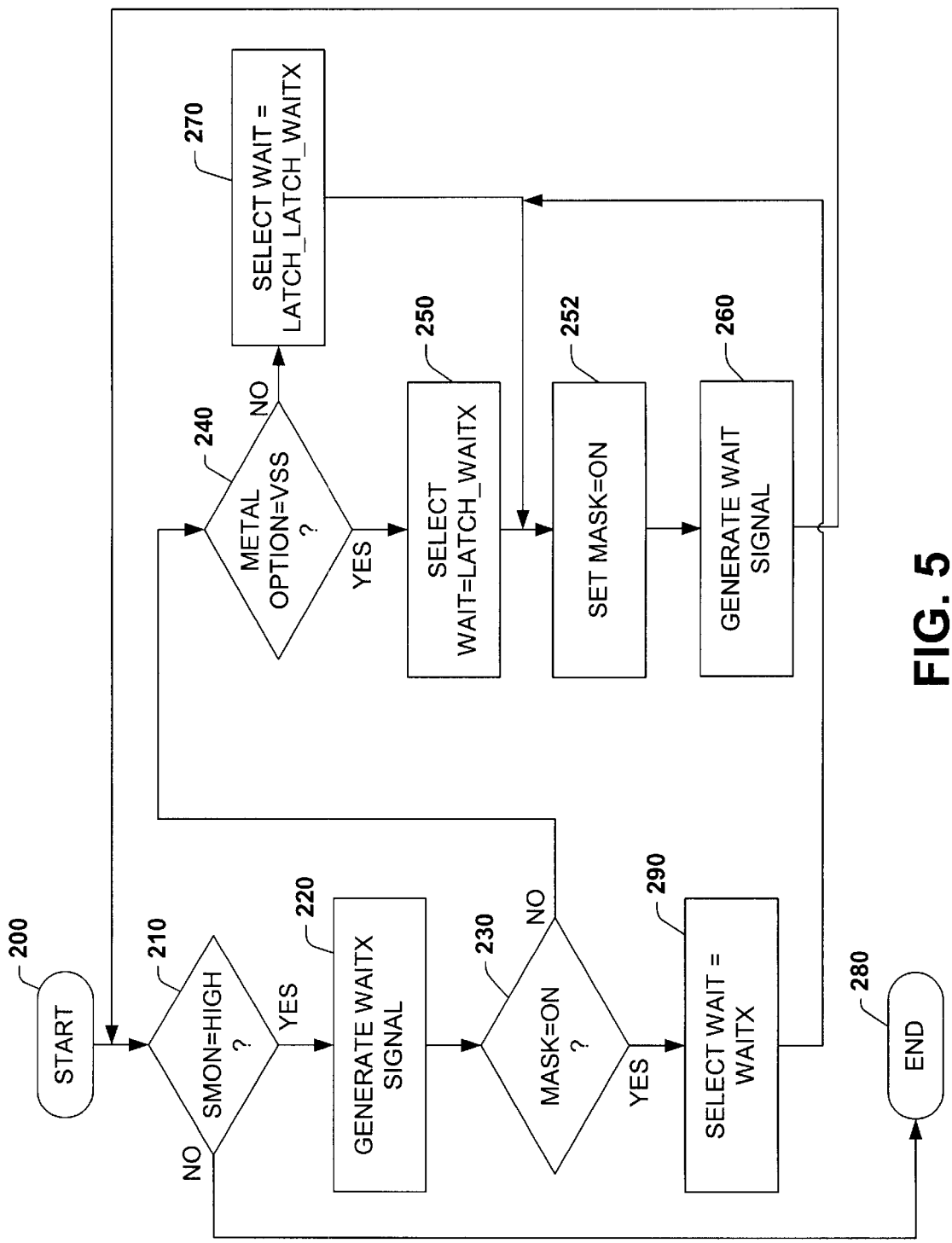
FIG. 5 is a flow diagram illustrating a methodology in accordance with the present invention.

FIG. 5 is a flow diagram illustrating a methodology for implementing a wait state, such as in conjunction with a memory circuit, in accordance with an aspect of the present invention. While, for purposes of simplicity of explanation, the methodology of FIG. 5 is shown and described as a series of steps, it is to be understood and appreciated that the present invention is not limited by the order of steps, as some steps may, in accordance with the present invention, occur in different orders and/or concurrently with other steps from that shown and described herein. Moreover, not all illustrated steps may be required to implement a methodology in accordance with an aspect the present invention.

The methodology begins at step 200 in which a memory circuit is powered up and operating parameters are initialized to the starting values, which includes setting a masking function to an OFF condition. The process proceeds to step 210 in which a determination is made as to whether the SMON signal is in a HIGH condition, such as in response to going from a LOW to a HIGH condition. If the determination is affirmative, indicating that the state machine has been activated to an ON condition, the methodology proceeds to step to 220. At step 220, a WAITX signal is generated. The WAITX signal is generated based on a timing signal from a timing circuit, such as shown and described with respect to FIG. 1. By way of example, the WAITX signal may be the sum of a program reset signal, a reset wait signal (which allows the state machine to wait during a verify condition), a START signal from an associated state machine, and a timer signal (T1).

Next, at step 230, a determination is made as to whether a masking function has been activated to an ON condition. As mentioned herein, the masking function may be implemented to inhibit imposing additional delay into a WAIT signal. If the determination at step 230 is negative, indicating that the masking function is not activated, the methodology proceeds to step 240. At step 240, a determination is made as to whether a metal option is set to VSS, which may be a default condition for the metal option. If the determination is positive, the process proceeds to step 250 in which the WAIT signal is selected to be equal to LATCH_WAITX. The process then proceeds to step 252 in which a masking function is set to an ON condition. The masking provides for a reduced amount of delay (e.g., by masking latched WAIT signals) for subsequent operations during the same user mode.

Next, at step 260, a corresponding WAIT signal is generated as a function of the LATCH_WAITX signal. If the determination at step 240 is negative, indicating that the metal option is not set to VSS, the process proceeds to step 270. This corresponds to a situation, for example, when a metal option is set to VCC. Those skilled in the art will understand and appreciate that other voltage signals and/or circuit architectures may be utilized to selectively control the duration of the wait state in accordance with the present invention.

At step 270 the WAIT signal is selected as the LATCH_LATCH_WAITX signal. In this situation, the WAITX signal has been latched twice (e.g., through a pair of DQ flip-flops), thereby imposing an increased delay when compared to the LATCH_WAITX signal at step 250 or the WAITX signal generated at step 220. From step 270, the process proceeds to step 252 in which the masking function is set to an ON condition, to prevent application of the increased wait signal for subsequent operations in the same user mode.

The process then proceeds to step 260, in which a corresponding WAIT signal is provided based on the selected WAIT signal, which in this case corresponds to the LATCH_LATCH_WAITX signal. The WAIT signal, which is provided to the state machine, causes the state machine to delay activation of one or more associated voltage pumps. This allows additional time for a reference voltage generator to ramp up and to stabilize at a desired reference voltage, which in turn may be used to program or erase associated memory cells. Because the reference voltage has additional time to stabilize at the beginning of a user mode, there is a reduced likelihood of programming errors.

From step 260, the process returns to step 210 in which the foregoing process steps are repeated. If the determination at step 210 is negative, indicating the state machine is not in an ON condition, the methodology proceeds to step 280 in which the process ends.

If during the process at step 230, it is determined that the masking function is ON, which occurs after providing a first WAIT signal of increased duration (e.g., LATCH_WAITX or LATCH_LATCH_WAITX), the process proceeds to step 290. At step 290, the WAIT signal is selected to be equal to the WAITX signal. As mentioned above, the masking function is turned to the ON condition when the state machine is ON and after the initial delayed WAIT signal is provided, such as at step 252. The initial delayed WAIT signal is implemented at the beginning of a user mode in which the flash memory may be written, erased or read. As a result, the methodology illustrated in FIG. 5 helps mitigate memory errors associated with inadequate stabilization of a reference voltage, such as may occur in response to performing a selected operation on the memory based on an incorrect regulation voltage.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Furthermore, to the extent that the term "includes" and variants thereof or the term "having" and variants thereof are used in the detailed description and/or the claims, such term is intended to be inclusive in a manner similar to the term "comprising."

What is claimed is:

1. A wait system for a memory cell, comprising:
    a first input for receiving at least one activation signal indicative of operations to be performed relative the memory cell during a user mode; and
    a delay system operative to provide a wait signal to delay performance of each operation relative the memory cell, the wait signal having a first duration in response to the at least one activation signal to delay performance of at least one initial operation relative the memory cell during a given user mode, the wait signal having a second duration, which is less than the first duration, to delay performance of subsequent operations relative the memory cell during the given user mode.

2. The wait system of claim 1, further comprising a second input to receive a timing signal indicative of a base duration, the latch system setting the duration of the wait signal as a function the base duration.

3. The wait system of claim 1, further comprising a selection system operative to receive a selection signal having at least two conditions, the wait signal having the first duration being selected from at least two signals having different associated durations, the selection system controlling which of the at least two signals to provide as the wait signal according to the condition of the selection signal.

4. The wait system of claim 3, further comprising a second input to receive a timing signal that defines a base duration, the duration of the wait signal being functionally related to the base duration.

5. The wait system of claim 4, wherein the wait signal is operative to delay performance of the at least one initial operation relative the memory cell during the given user mode by a first amount functionally related to the base duration when the selection signal has a first condition, the wait signal being operative to delay performance of subsequent operations relative the memory cell during the given user mode by a second amount functionally related to the base duration, which second amount is greater than the first amount, when the selection signal has a second condition.

6. The wait system of claim 3, wherein the wait system is part of an integrated circuit, the selection system further comprising a metal option associated with the integrated circuit, the metal option having at least two user-selectable conditions, each condition of the metal option providing a different selection signal, thereby controlling which of the at least two signals to provide as the wait signal.

7. The wait system of claim 1, further comprising a masking system operative to inhibit application of the wait signal having the first duration after the at least one initial operation relative the memory cell during the given user mode and to permit application of the wait signal having the second duration thereafter.

8. A system to delay operations being performed relative the memory cell, comprising:
   means for receiving at least one activation signal indicative of operations to be performed relative the memory cell during a given user mode;
   means for delaying performance of at least one initial operation relative the memory cell by a first duration during the given user mode; and
   means for delaying performance of subsequent operations relative the memory cell during the given user mode by a second duration, which is less than the first duration.

9. The system of claim 8, further comprising means for selecting which of at least two different durations is to be utilized to delay performance of the at least one initial operation relative the memory cell.

10. The system of claim 9, wherein each of the at least two different durations is functionally related to a common base duration.

11. The system of claim 9, wherein the system is part of an integrated circuit, the means for selecting further comprising a metal option associated with the integrated circuit, the metal option having at least two user-selectable conditions, each condition of the metal option being operative to set which of the at least two different durations to utilize to delay performance of the at least one initial operation relative the memory cell.

12. The system of claim 8, further comprising means for masking application of the first duration after performance of the at least one initial operation relative the memory cell during the given user mode and for permitting subsequent application the second duration thereafter during the given user mode.

13. A memory system comprising:
   a reference voltage generator operative to, when activated in response to an activation signal, ramp up to and provide a reference signal at a predetermined level;
   a control system operative to, when activated in response to the activation signal, control operations performed relative to at least one memory cell based on the reference signal; and
   a wait system operative to provide a wait signal to the control system in connection with each operation to be performed relative to the at least one memory cell;
   wherein the control system delays performance of at least an initial operation relative the at least one memory cell by a first duration in response to an initial wait signal provided by the wait system during a given user mode, and the control system delays performance of subsequent operations relative the at least one memory cell in the given user mode by a second duration, which is less than the first duration, in response to subsequent wait signals provided by the wait system in the given user mode, whereby the delayed initial operation relative the at least one memory cell in the given user mode facilitates stabilization of the reference voltage prior to performing the delayed operation.

14. The system of claim 13, wherein the wait system further comprises an input operative to receive a timing signal indicative of a base duration, the wait system setting the wait signal as a function the base duration.

15. The system of claim 13, wherein the wait system further comprises a selection system operative to receive a selection signal having at least two conditions, the initial wait signal being selected from at least two signals having different associated durations, the selection system controlling which of the at least two signals to provide as the wait signal according to the condition of the selection signal.

16. The system of claim 15, wherein the memory system is part of an integrated circuit, the selection system further comprising a metal option associated with the integrated circuit, the metal option having at least two user-selectable conditions, each condition of the metal option providing a different selection signal, thereby controlling which of the at least two signals to provide as the wait signal.

17. The system of claim 15, wherein the wait system further comprises an input operative to receive a timing signal indicative of a base duration, the wait system setting the wait signal based on the base duration.

18. The system of claim 17, wherein the control system is operative to delay performance of the at least one initial operation relative the at least one memory cell during the given user mode by a first amount functionally related to the base duration when the selection signal has a first condition, the wait signal being operative to delay performance of subsequent operations relative the memory cell during the given user mode by a second amount functionally related to the base duration, which second amount is greater than the first amount, when the selection signal has a second condition.

19. The system of claim 13, further comprising a masking system operative to inhibit application of the initial wait signal after the control system initiates performance of the at least one initial operation relative the memory cell during the given user mode and to permit application of the wait signal having the second duration thereafter.

20. A method to facilitate operations performed relative at least one memory cell, comprising:
   ramping up to and providing a reference signal at a predetermined level in response to receiving an activation signal;
   providing an initial wait signal to delay at least an initial operation to be performed relative the memory cell and providing a subsequent wait signal for subsequent operations to be performed relative the memory cell;
   delaying use of the reference signal for the initial operation relative the memory cell by a first duration in response to the initial wait signal provided in a given user mode; and
   delaying use of the reference signal for subsequent operations relative the memory cell by a second duration, which is less than the first duration, in response to the subsequent wait signal provided in the given user mode.

21. The method of claim 20, further comprising receiving a timing signal that defines a base duration, wherein each of the first and second durations are functionally related to the base duration.

22. The method of claim 20, further comprising selecting which of at least two different signals is to be as the initial wait signal, each of the at least two different signals being operative to delay use of the reference signal for the initial operation relative the memory cell by a different duration.

23. The method of claim 22, wherein, the selection further comprises selecting a condition of an associated metal option, the metal option having at least two selectable conditions, each condition of the metal option being operative to set which of the at least two different signals is to be utilized as the wait signal.

24. The method of claim 20, further comprising masking application of the initial wait signal for the subsequent operations in the given user mode to be performed relative the memory cell so as to permit application of the subsequent wait signal thereafter during the given user mode.

* * * * *